United States Patent [19]

Muller et al.

[11] Patent Number: 5,088,098
[45] Date of Patent: Feb. 11, 1992

[54] THERMOELECTRIC COOLER CONTROL CIRCUIT

[75] Inventors: Mathias Muller, Lexington; Dean Stoneback, Souderton, both of Pa.

[73] Assignee: General Instrument Corporation, Hatboro, Pa.

[21] Appl. No.: 598,190

[22] Filed: Oct. 16, 1990

[51] Int. Cl.$^5$ ............................................. H01S 3/043
[52] U.S. Cl. ........................................ 372/34; 372/29; 372/38; 165/26; 364/557
[58] Field of Search ............... 372/34, 36, 38; 165/26; 357/81; 364/104, 557

[56] References Cited
U.S. PATENT DOCUMENTS 4,288,854  9/1981  Burroughs ......................... 165/26 X
4,631,728 12/1986  Simons ................................. 372/38
4,922,480  5/1990  Bosch ................................... 370/3

Primary Examiner—William L. Sikes
Assistant Examiner—Galen J. Hansen
Attorney, Agent, or Firm—Barry R. Lipsitz

[57] ABSTRACT

A thermoelectric cooler temperature control circuit provides a periodic control signal having a substantially constant peak-to-peak magnitude and an average value dependent on a sensed temperature to be regulated. The control signal is coupled to control the heating or cooling of a thermoelectric cooler. In a preferred embodiment, complementary positive and negative going control signal pulse streams are provided. A switch selectively couples one of the complementary pulse streams to cool the thermolectric cooler or the other stream to heat the cooler. The control signal pulse streams can be pulse width modulated signals.

8 Claims, 3 Drawing Sheets

THERMOELECTRIC COOLER CONTROL CIRCUIT

BACKGROUND OF THE INVENTION

The present invention relates to thermoelectric coolers, and more particularly to a control circuit for regulating the temperature of a laser or other device coupled to a thermoelectric cooler.

Temperature control of electronic devices is an important design consideration. Solid-state components such as transistors generate heat in operation. Excessive amounts of heat can damage the component or other sensitive elements of a circuit in close proximity.

With advances in optical technologies, such as optical fiber communication, electrical signal processing is being replaced in many applications by optical signal processing. For example, cable television signals previously transmitted over wire (i.e., coaxial cable) are now capable of being carried on optical fiber networks. Optical transmission technologies provide greater bandwidth, better signal-to-noise ratio, and potentially lower cost.

In order to transmit a signal over an optical fiber, lasers are used to provide a coherent light source. The lasers generate a substantial amount of heat, and must be cooled to prevent failure. Pump lasers in particular require a great deal of cooling for reliable operation.

In cable television applications, lasers are provided along the communication network for signal amplification. Signal distribution amplifiers are mounted on utility poles and must withstand severe environmental conditions. The internal temperature of the amplifier housing can range, for example, from −20° C. to 90° C. The distribution amplifiers must be designed to operate over this entire temperature range. In order to maintain the temperature of the lasers used in the amplifiers within their design specifications, cooling and heating devices are required.

One device that can be used to regulate the temperature of a laser is a thermoelectric cooler ("TEC"). These devices are small heat pumps that obey the laws of thermodynamics as do conventional mechanical heat pumps such as refrigerators. TECs, however, are solid-state devices that operate as Peltier coolers. A single-stage thermoelectric cooler is composed of a matrix of thermoelectric couples, connected electrically in series and thermally in parallel. When current is conducted through the thermoelectric couples in one direction, a first plate of the TEC cools down and a complementary second parallel plate heats up. When current is conducted in the other direction, the first plate heats up and the second plate cools down.

TEC cooling is proportional to the applied current. The power dissipated by Joule heating in the TEC is proportional to the square of the current. Thus, an increase in current above a certain value will result in less net cooling because the Joule heating is increasing at a faster rate than the Peltier cooling. It is therefore important to carefully control the current that is applied to the TEC.

Known control circuits for regulating the temperature of a thermoelectric cooler use a linear driver to input current to the cooler. Because of their design, the operation of linear drivers can be very inefficient, generating additional heat that must be dissipated into a heat sink. Since they operate in a linear fashion, these drivers are always drawing current and must dissipate power constantly. Such operation defeats the cooling function of the TEC, and is particularly damaging in a cable television fiber distribution amplifier that encloses the circuitry in a heat retaining weather-tight box.

It would be advantageous to provide a temperature control circuit for a thermoelectric cooler that operates in a nonlinear fashion. Both heating and cooling of a device to be protected should be provided in a reliable and efficient manner. It would be further advantageous to provide such a circuit that operates using the same voltages already present in the circuitry for the device being protected. The present invention provides a control circuit and method for driving a thermoelectric cooler having these advantages.

SUMMARY OF THE INVENTION

In accordance with the present invention, a temperature control circuit is provided for a thermoelectric cooler. Temperature sensor means provide an output signal related to a sensed temperature. Means responsive to the output signal generate a periodic control signal having a substantially constant peak-to-peak magnitude and an average value dependent on the sensed temperature. The control signal is coupled to regulate the temperature of a thermoelectric cooler.

In a preferred embodiment, complementary positive and negative going control signal pulse streams are provided. Switch means selectively couple one of the complementary pulse streams to cool the thermoelectric cooler or the other pulse stream to heat the cooler. In order to provide the pulse streams with an average value dependent on the sensed temperature, the pulse streams can be pulse width modulated. Such modulation imparts a variable duty cycle to the signals that depends on the magnitude of the temperature sensor output signal.

The temperature sensor means can be designed to provide a first polarity output signal when the sensed temperature is on one side of a threshold (e.g., above the threshold temperature) and a second polarity when the sensed temperature is on the other side of the threshold (e.g., below the threshold temperature). The different polarities can be used to signal the circuitry to either heat or cool the thermoelectric cooler. Means for obtaining an absolute value of the output signal are provided for use in generating the control signal.

In a more specific embodiment, apparatus is provided for regulating the temperature of a laser. A thermoelectric cooler is thermally coupled to the laser. Temperature sensor means, thermally coupled to the laser, provide an output signal related to the laser temperature. Means responsive to the output signal generate a periodic control signal having a substantially constant peak-to-peak magnitude and an average value dependent on the laser temperature. A control signal is coupled to the cooler for regulating the laser temperature.

A method is provided for driving a thermoelectric cooler. A temperature to be controlled by the cooler is sensed, and a periodic control signal is generated having a substantially constant peak-to-peak magnitude and an average value dependent on the sensed temperature. The control signal is coupled to regulate the temperature of the cooler. In a preferred embodiment, two complementary control signal pulse streams are provided, one having a positive polarity and the other having a negative polarity. One of the complementary pulse streams is coupled to the cooler to provide a cooling effect when the temperature to be controlled is above a threshold. The other pulse stream is coupled to the cooler to provide a heating effect when the temperature to be controlled is below the threshold.

DETAILED DESCRIPTION OF THE INVENTION

Figure 1:
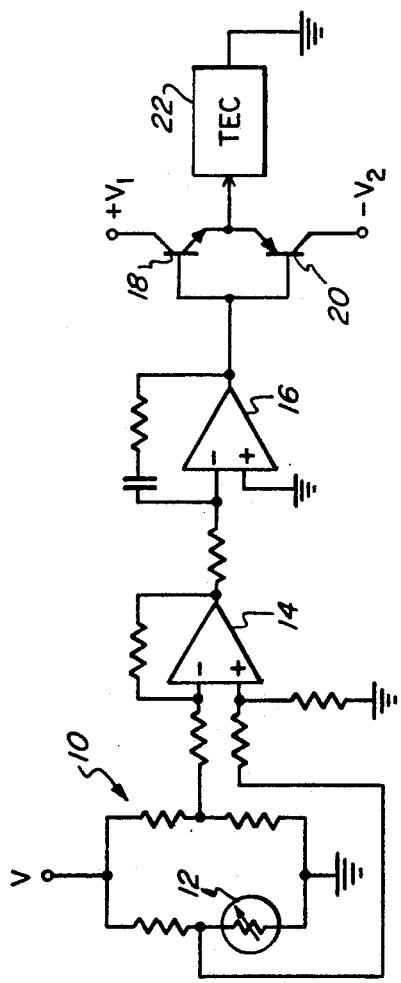
FIG. 1 is a schematic diagram of a prior art thermoelectric cooler control circuit.

FIG. 1 illustrates a prior art thermoelectric cooler control circuit. A conventional differential bridge amplifier uses a differential DC amplifier 14 to amplify the output of a transducer bridge generally designated 10. One element of the bridge is a thermistor 12 that has a resistance which varies with temperature. Nominally, the four arms of bridge 10 have equal resistances. For example, thermistor 12 can have a resistance of 10K ohms at 25° C., and each of the remaining three branches of the bridge can comprise a 10K ohm resistor. As the temperature rises or falls from 25° C., the fractional change of the thermistor resistance is input to amplifier 14 and amplified.

The amplified difference signal output from amplifier 14 is integrated by an active filter 16. The resultant signal controls a pair of transistors 18, 20 each configured as an emitter follower. These transistors determine which polarity and how much current is applied to a thermoelectric cooler 22. Since transistors 18, 20 operate in a linear fashion, they can dissipate a substantial amount of power when turned on. Thus, for example, where the thermoelectric cooler requires a current of two amps and there is a three volt drop across transistor 18 or 20, a total of six watts will have to be dissipated by the transistor.

In accordance with the present invention, the linear driver provided by emitter follower transistors 18, 20 is replaced by a lossless switch that is either on or off, and applies only the voltage necessary to produce the required TEC drive current. A circuit in accordance with the present invention is illustrated in block diagram form in FIG. 2. A conventional differential bridge amplifier is provided by bridge 10 and difference amplifier 30. One leg of bridge 10 contains a thermistor 12, as described above in connection with the prior art. Those skilled in the art will appreciate that other circuit arrangements, such as a simple voltage divider, can be used in place of the bridge circuit illustrated in the figures.

The output of differential amplifier 30 is input to a filter 32 that can comprise an active filter for eliminating noise. The filtered difference signal is input to an inverter 34, and an absolute value circuit 36 obtains the absolute value of the inverted and noninverted signals. The resultant output signal is input to a pulse width modulator 38 that generates a pair of periodic control signals that are equal but of opposite polarity. Each control signal comprises a pulse stream having a substantially constant peak-to-peak magnitude with an average value dependent on the temperature sensed by thermistor 12. Both the positive going and negative going pulse streams are input to a heat/cool switch 40 that selects one or the other of the pulse streams depending on which of the signals from filter 32 and inverter 34 is positive. The selected pulse stream output from switch 40 is filtered and input to thermoelectric cooler 42 to provide heating or cooling to a device, such as a laser, to which the TEC is mounted. A loop gain amplifier circuit 44 monitors the voltage across a resistor 46 (typically 0.01 ohm or so) and feeds the result back to set the voltage required to produce the desired output current.

Although the average value of the processed difference signal is provided by a pulse width modulator 38 in the embodiment illustrated, it should be appreciated that other techniques for providing such a signal can be substituted. For example, pulse position modulation could be used.

Figure 2:
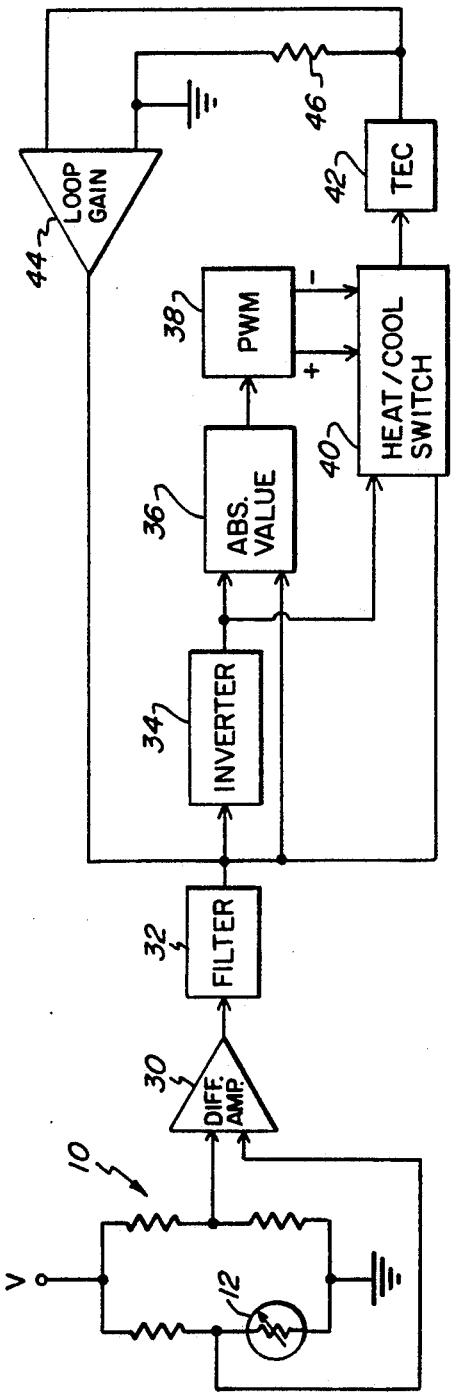
FIG. 2 is a block diagram illustrating a thermoelectric cooler control circuit in accordance with the present invention.

The circuit of FIG. 2 differs from the prior art in that it provides the voltage necessary to operate the thermoelectric cooler 42 at a desired current without a significant voltage drop across an output transistor. Thus, the inefficient dissipation of energy is avoided. This advantage is achieved by operating the output switching transistors in a discrete on/off mode instead of in a linear mode. When cooling is necessary, a pulse width modulated signal of a first polarity is input to the thermoelectric cooler via switch 40. Similarly, when heating is required, the opposite polarity pulse stream is coupled by switch 40 to thermoelectric cooler 42.

Figure 3:
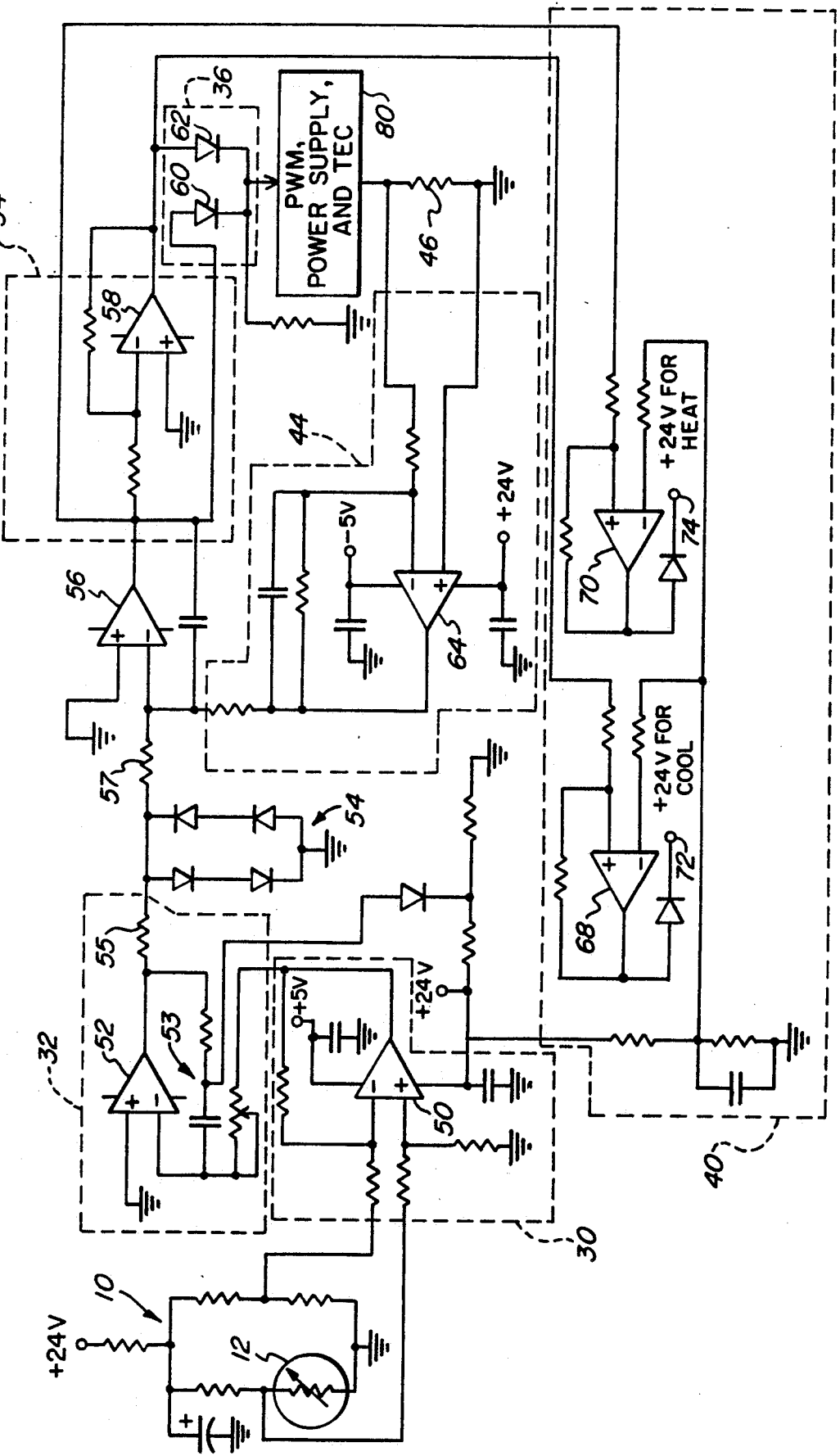
FIG. 3 is a schematic diagram of portions of the control circuit depicted in FIG. 2.
Figure 4:
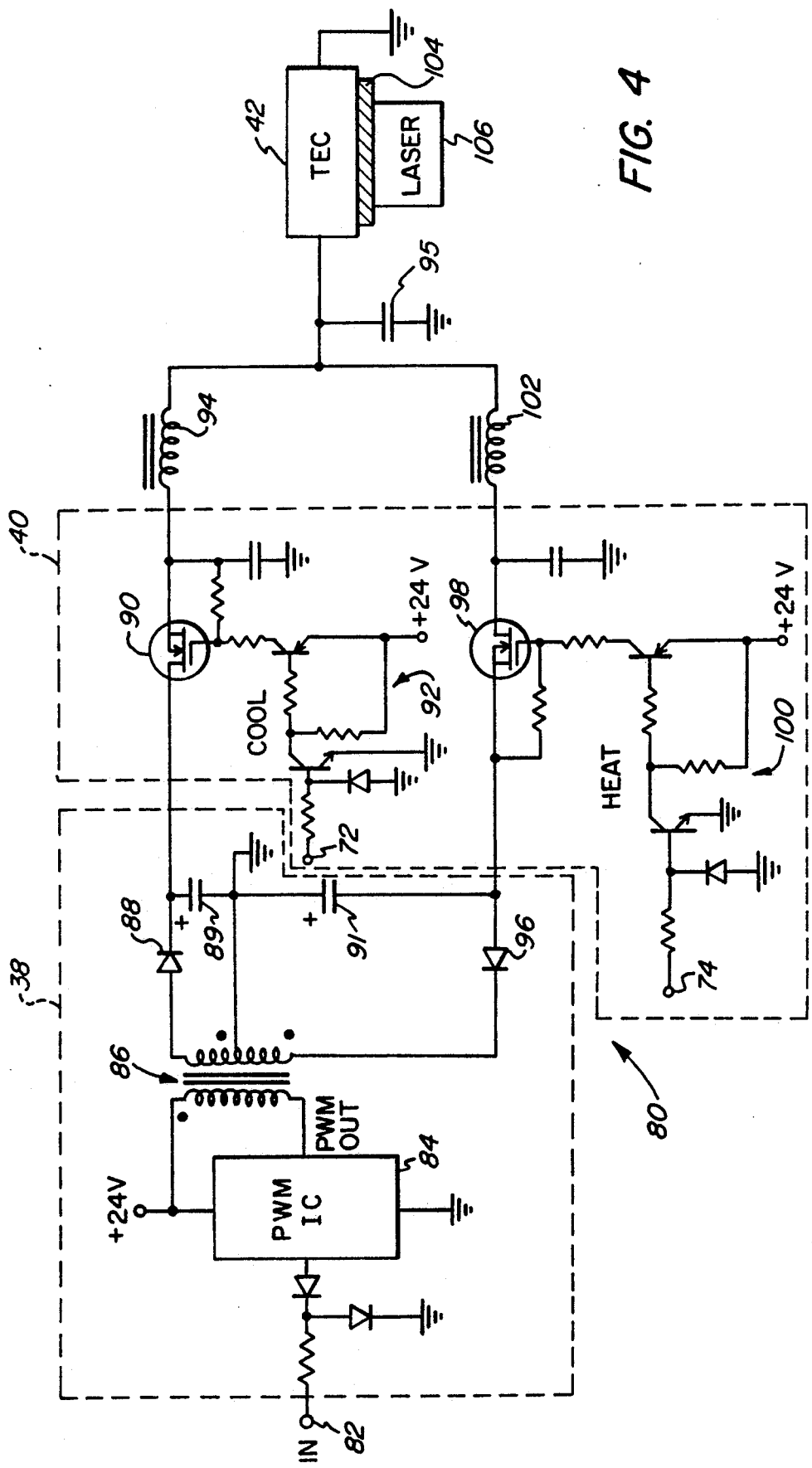
FIG. 4 is a schematic diagram of the remaining portions of the control circuit of FIG. 2.

Circuitry in accordance with the present invention is shown in more detailed form in the schematic diagrams of FIGS. 3 and 4. Elements of the FIG. 3 and 4 schematics that correspond to portions of the block diagram of FIG. 2 have been indicated by dashed line boxes.

As shown in FIG. 3, differential amplifier 30 comprises an operational amplifier 50 connected in a conventional manner. Filter circuit 32 comprises an operational amplifier 52 coupled to an RC filter generally designated 53. Diodes 54 clamp the filtered difference signal to a predetermined voltage. The gain of the loop is established by resistors 55, 57.

Amplifier 56 is provided to amplify the filtered difference signal for input to inverter 34 (comprising operational amplifier 58) and to a diode 60. The inverted output from inverter 34 is input to a corresponding diode 62. These diodes are the absolute value circuit 36 that provides the positive filtered and amplified difference signal to pulse width modulator 38. The pulse width modulator, power supply, and thermoelectric cooler are designated by reference numeral 80 in FIG. 3, and shown in greater detail in FIG. 4 described below.

The heat/cool switch 40 comprises operational amplifiers 68 and 70 having noninverting inputs coupled, respectively, to the outputs of amplifiers 58 and 56. Operational amplifiers 56, 58 provide unit gain but opposite polarity. When the output of amplifier 58 is positive, a cooling control signal (i.e., +24 volts) is output at terminal 72. Conversely, when the output of amplifier 56 is positive, a heating control signal is output on terminal 74.

Loop gain amplifier 44 comprises an operational amplifier 64 coupled to monitor the voltage across resistor 46 and provide a gain control signal to amplifier 56.

Pulse width modulator 38 and heat/cool switch 40 are depicted in detail in FIG. 4. The signal output from absolute value circuit 36 is input at terminal 82. A pulse width modulator integrated circuit 84, such as the LT1071 manufactured by Linear Technology Corporation of Milpitas, Calif., converts the input signal to a pulse stream having a variable duty cycle dependent upon the temperature sensed by thermistor 12. A conventional flyback converter comprising transformer 86, diodes 88, 96, and associated capacitors 89, 91 provides complementary positive going and negative going pulse width modulated control signal pulse streams for selectively regulating the temperature of thermoelectric cooler 42.

The positive going pulse stream from pulse width modulator 38 is input to a field effect transistor ("FET") 90 that is turned on by transistor circuit 92 when the cooling voltage is present at terminal 72. When this occurs, the positive going pulse stream is coupled to choke 94 where it is filtered and coupled to thermoelectric cooler 42. Additional filtering is provided by a capacitor 95.

When the heating voltage is present at terminal 74, transistor circuit 100 turns on FET 98 to couple the negative going control signal pulse stream to thermoelectric cooler 42 via filtering choke 102. By operation of the circuit, either the cooling pulse stream or the heating pulse stream, but not both, will be coupled to thermoelectric cooler 42 at any one time. Since the determination of which signal is applied is derived from the relationship of the temperature sensed by thermistor 12 to a threshold value, and the average value of the selected pulse stream is determined by the measured deviation of the temperature from the threshold, excellent regulation of the TEC temperature is maintained without dissipating unused energy as heat.

Thermoelectric cooler 42 can be used to regulate the temperature of many types of devices. As noted above, in an optical fiber cable television system, the temperature of a laser can be regulated by coupling the TEC via a conventional thermal coupler 104 to a semiconductor laser 106 or the like as shown in FIG. 4.

It will now be appreciated that the present invention provides a control circuit for regulating the temperature of a laser or similar device with a thermoelectric cooler. A thermistor, which is thermally coupled to the laser, is part of a bridge circuit. The output of the bridge circuit is fed to an amplifier/filter that processes the signal. A heat/cool switch uses the polarity of the error voltage output from the bridge circuit to determine whether the laser is too hot, too cold, or just right and couples an appropriate control signal pulse stream to the thermoelectric cooler. An absolute value circuit provides an output proportional to the absolute value of the input error voltage for use in generating the control signal pulse streams. The pulse streams, which may be pulse width modulated, have a fixed frequency but variable duty cycle that is proportional to the input error voltage. The technique used for driving the thermoelectric cooler in accordance with the present invention is more efficient than the use of prior art linear drivers.

Although the invention has been described in connection with a specific embodiment, those skilled in the art will appreciate that numerous modifications and adaptations may be made thereto without departing from the spirit and scope of the invention, as set forth in the following claims.

We claim:

1. A temperature control circuit for a thermoelectric cooler comprising:

temperature sensor means for providing an output signal related to a sensed temperature, said output signal having a first polarity when the sensed temperature is on one side of a threshold and a second polarity when the sensed temperature is on the other side of said threshold;
   means for obtaining an absolute value of said output signal;
   means responsive to the absolute value of said output signal for generating complementary positive and negative going control signal pulse streams, each having a substantially constant peak-to-peak magnitude and an average value that varies over a continuous range dependent on said sensed temperature; and
   means for selectively coupling said control signal pulse streams to said thermoelectric cooler to regulate the temperature thereof.

2. A circuit in accordance with claim 1 wherein said control signal pulse streams are pulse width modulated.

3. Apparatus for regulating the temperature of a laser comprising:

a thermoelectric cooler;
   means for thermally coupling said cooler to a laser;
   temperature sensor means thermally coupled to said laser for providing an output signal related to the laser temperature, said output signal having a first polarity when the sensed temperature is on one side of a threshold and a second polarity when the sensed temperature is on the other side of said threshold;
   means for obtaining an absolute value of said output signal;
   means responsive to the absolute value of said output signal for generating complementary positive and negative going control signal pulse streams, each having a substantially constant peak-to-peak magnitude and an average value that varies over a continuous range dependent on said laser temperature; and
   means for selectively coupling said control signal pulse streams to said cooler to regulate the temperature of said laser.

4. Apparatus in accordance with claim 3 wherein:

said output signal at the first polarity actuates said coupling means to provide a cooling control signal to said cooler; and
   said output signal at the second polarity actuates said coupling means to provide a heating control signal to said cooler.

5. Apparatus in accordance with claim 3 wherein said control signal pulse streams are pulse width modulated.

6. Apparatus in accordance with claim 3 wherein said control signal has a variable duty cycle dependent on said laser temperature.

7. Apparatus in accordance with claim 6 wherein said control signal is pulse width modulated.

8. A method for driving a thermoelectric cooler comprising the steps of:

sensing a temperature to be controlled by the cooler;
   generating a pair of complementary periodic control signal pulse streams, each having substantially constant peak-to-peak magnitudes and average values that vary over a continuous range dependent on said sensed temperature; and
   selectively coupling one or the other of said control signal pulse streams to said thermoelectric cooler to regulate the temperature of said cooler.

* * * * *